(12) United States Patent
Delaunay

(10) Patent No.: US 8,941,145 B2
(45) Date of Patent: Jan. 27, 2015

(54) SYSTEMS AND METHODS FOR DRY ETCHING A PHOTODETECTOR ARRAY

(71) Applicant: The Boeing Company, Chicago, IL (US)

(72) Inventor: Pierre-Yves Delaunay, Santa Monica, CA (US)

(73) Assignee: The Boeing Company, Chicago, IL (US)

(*) Notice: Subject to any disclaimer, the term of this patent is extended or adjusted under 35 U.S.C. 154(b) by 0 days.

(21) Appl. No.: 13/919,541

(22) Filed: Jun. 17, 2013

(65) Prior Publication Data

US 2014/0367822 A1 Dec. 18, 2014

(51) Int. Cl.
| | |
|---|---|
| H01L 21/18 | (2006.01) |
| H01L 21/301 | (2006.01) |
| H01L 21/302 | (2006.01) |
| H01L 21/3065 | (2006.01) |
| H01L 31/0304 | (2006.01) |
| H01L 31/0352 | (2006.01) |
| H01L 27/146 | (2006.01) |
| H01L 21/66 | (2006.01) |

(52) U.S. Cl.
CPC .......... *H01L 27/14683* (2013.01); *H01L 22/12* (2013.01); *H01L 27/14601* (2013.01)
USPC ............ 257/189; 257/E31.019; 257/E31.032; 257/E31.113; 438/81; 438/424; 438/710; 438/718

(58) Field of Classification Search
None
See application file for complete search history.

(56) References Cited

U.S. PATENT DOCUMENTS

| | | | |
|---|---|---|---|
| 4,551,629 | A | 11/1985 | Carson et al. |
| 4,672,737 | A | 6/1987 | Carson et al. |
| 6,541,773 | B1 | 4/2003 | Iwabuchi et al. |
| 6,909,554 | B2 | 6/2005 | Liu et al. |
| 7,928,389 | B1 | 4/2011 | Yap et al. |
| 7,977,637 | B1 | 7/2011 | Yap et al. |
| 8,264,019 | B2 | 9/2012 | Mazzillo et al. |
| 8,338,219 | B2 | 12/2012 | Mazzillo et al. |
| 2011/0037097 | A1* | 2/2011 | Scott et al. .................. 257/184 |
| 2011/0291103 | A1 | 12/2011 | Mazzillo et al. |
| 2013/0248821 | A1* | 9/2013 | Miura et al. .................. 257/21 |

OTHER PUBLICATIONS

Sun, Jian, and Jurgen Kosel. "Room Temperature Inductively Coupled Plasma Etching of InAs/InSb in BCl3/Cl2/Ar." Microelectronic Engineering 98 (2012): 222-25.*
Umana-Membreno, G. A., B. Klein, E. P. G. Smith, J. Antoszewski, E. Plis, S. M. Johnson, S. Krishna, D. R. Rhiger, and L. Faraone. "Electron Transport in InAsSb-Based NBn Photodetector Structures." IEEE Transactions on Electron Devices 60.1 (2013): 510-12.*

(Continued)

*Primary Examiner* — Joseph Schoenholtz
(74) *Attorney, Agent, or Firm* — Armstrong Teasdale LLP

(57) ABSTRACT

Systems and methods for dry eteching a photodetector array based on InAsSb are provided. A method for fabricating an array of photodetectors includes receiving a pattern of an array of photodetectors formed from InAsSb, the pattern including at least one trench defined between adjacent photodetectors, and dry etching the at least one trench with a plasma including $BrCl_3$ and Ar.

20 Claims, 6 Drawing Sheets

(56) References Cited

OTHER PUBLICATIONS

Delaunay, Pierre-Yves, Binh Minh Nguyen, Darin Hofman, and Manijeh Razeghi. "Substrate Removal for High Quantum Efficiency Back Side Illuminated Type-II InAs/GaSb Photodetectors." Applied Physics Letters 91.23 (2007): 231106.*

Rehm, Robert, et. al., "Substrate Removal of Dual-colour InAs/GaSb Superlattice Focal Plane Arrays." Physica Status Solidi (c) 9.2 (2012): 318-21.*

Rogalski, A., "Optical Detectors for Focal Plane Arrays", Opto-Electronics Review, 12(2) pp. 221-245 (2004).*

* cited by examiner

SYSTEMS AND METHODS FOR DRY ETCHING A PHOTODETECTOR ARRAY

BACKGROUND

The field of the disclosure relates generally to dry etching, and more specifically, to methods and systems for dry etching of photodetectors.

Generally, photodetectors are used in a variety of camera systems to detect light. The photodetectors include an array of sensors or Focal Plane Array (FPA) that is formed by an array of sensors electrically insulated from one another. One form of insulating the sensors from one another is through etching in which material is removed to create trenches between sensors. A wet etch process is an isotropic process whereby a solution (e.g., acid or base) is used to remove material. A dry etch process is an anisotropic process in which material is removed after exposure to a plasma. In some known wet etch processes, the acid solution etches laterally in the trenches leading to a reduction in optical response per pixel (i.e., loss of fill factor) and in some known dry etching processes, organic compounds are formed during deep etchings that reduce optical response per pixel or increase the dark current.

BRIEF DESCRIPTION

In one aspect, a method for fabricating an array of photodetectors is provided. The method includes receiving a pattern of an array of photodetectors formed from InAsSb, the pattern including at least one trench defined between adjacent photodetectors, and dry etching the at least one trench with a plasma including $BrCl_3$ and Ar.

In another aspect, a method of imaging using a photodetector array is provided. The method includes providing a photodetector array and receiving wavelengths by a first photodetector of the photodetector array and a second photodetector of the photodetector array, wherein a trench is formed between the first photodetector and the second photodetector, the trench formed by dry etching using $BrCl_3$ and Ar.

In yet another aspect, a photodetector array for use in imaging is provided. The photodetector array includes a first photodetector formed from InAsSb, a second photodetector formed from InAsSb, and a trench formed between the first photodetector and the second photodetector, wherein the trench is formed using $BrCl_3$ and Ar.

The features, functions, and advantages that have been discussed can be achieved independently in various embodiments or may be combined in yet other embodiments, further details of which can be seen with reference to the following description and drawings.

DETAILED DESCRIPTION

The systems and methods described herein enable dry etching of photodetectors based on InAsSb. As used herein, the term "dry etching" or "etching" refers to the removal of material by exposure to ions or plasma of reactive gases that displaces or dislodges the material.

Figure 1:
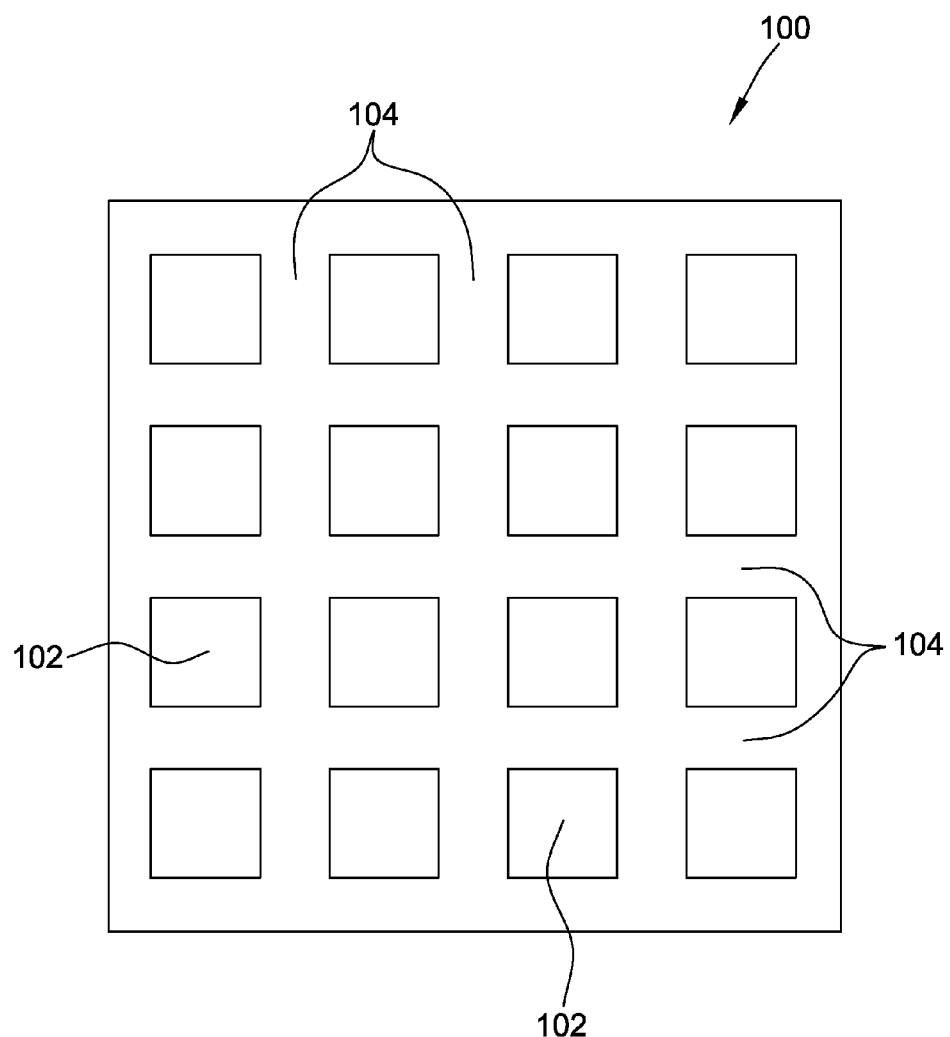
FIG. 1 is a perspective view of an exemplary photodetector array.

FIG. 1 is a perspective view of an exemplary photodetector array 100. In the exemplary embodiment, photodetector array 100 includes an array of photodetectors or sensors 102 formed on a semiconductor substrate. Sensors 102 are separated by trenches 104 formed by a dry etch process. In one embodiment, photodetector 100 includes 16 sensors that are 27 um wide. Alternatively, photodetector array 100 can include any number of sensors having any size and shape that facilitates imaging as described herein. Sensors 102 are formed from a material including InAsSb and may be configured to operate in a dual band capacity such that sensors 102 detect two wavelengths. In one embodiment, photodetector array 100 is configured to be incorporated into an infrared imaging device.

Figure 2:
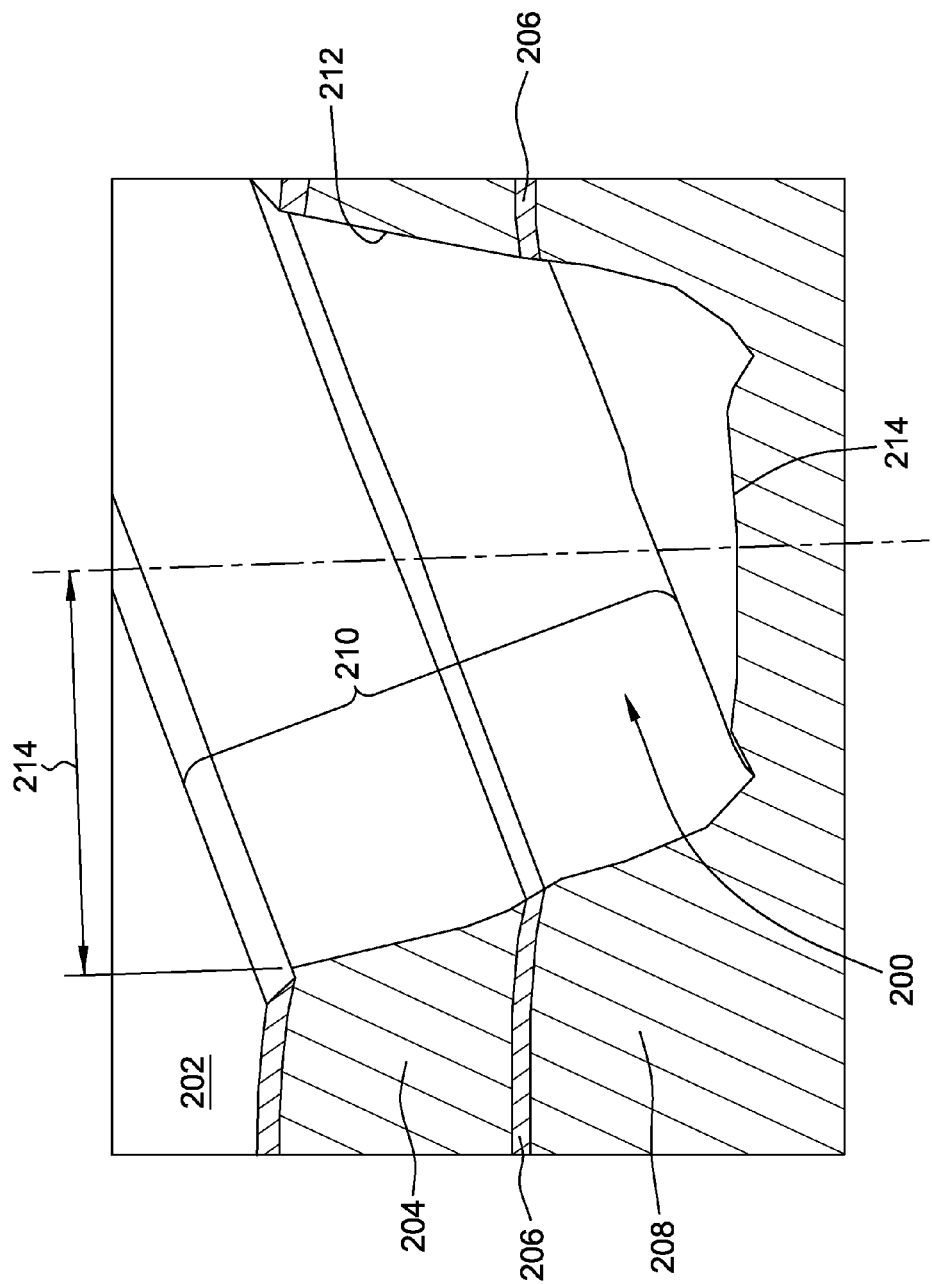
FIG. 2 is perspective view of an illustration of a trench that may be used in the photodetector array shown in FIG. 1.
Figure 3:
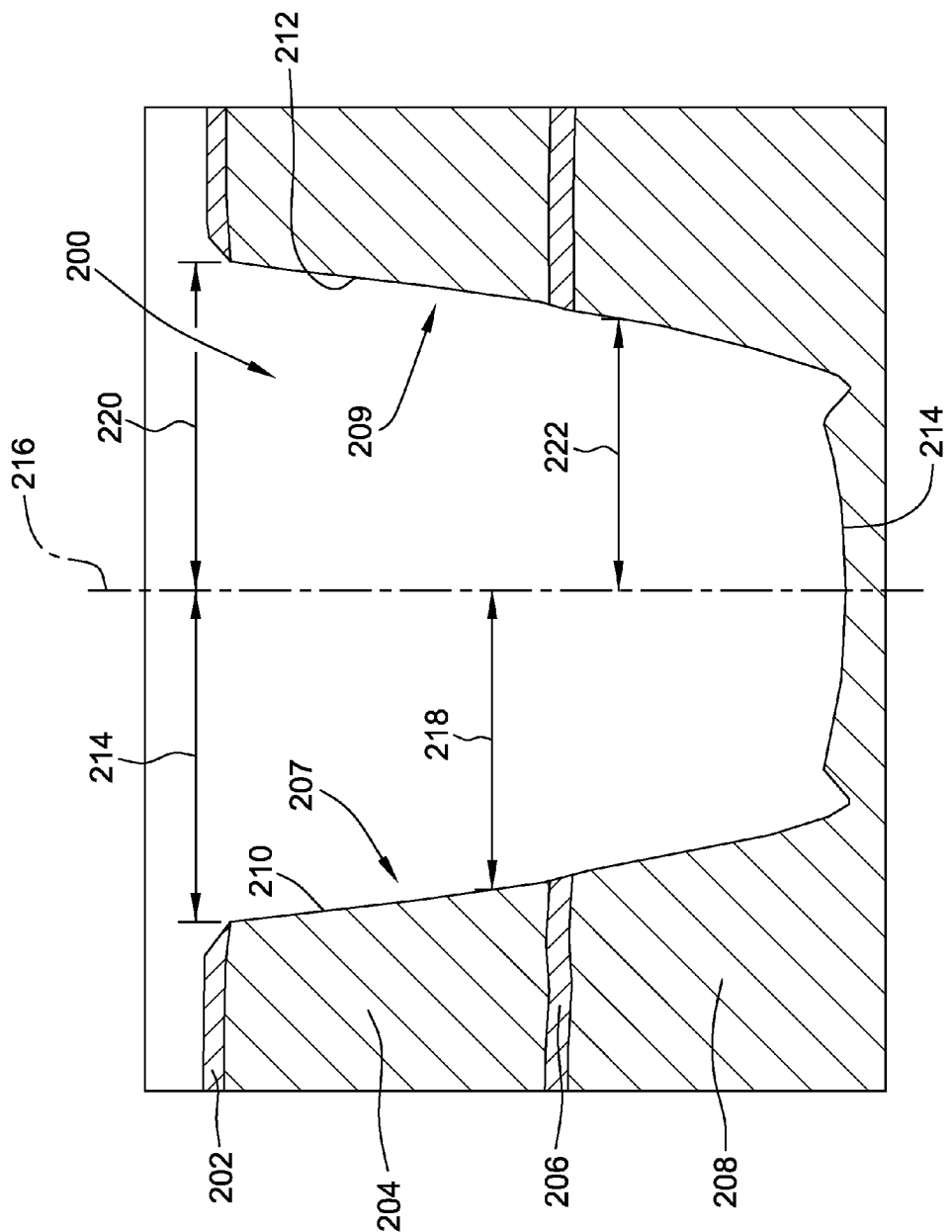
FIG. 3 is an alternate perspective view of an illustration of a trench that may be used in the photodetector array shown in FIG. 1.

FIG. 2 is perspective view of an illustration of a trench 200 that may be used in photodetector array 100 shown in FIG. 1 and FIG. 3 is an alternate perspective view of trench 200 shown in FIG. 2. In the exemplary embodiment, trench 200 is a void created in a photodetector array, such as photodetector array 100. Trench 200 is created by etching away material in photodetector array 100. In one embodiment, trench 200 etches or removes a first light absorbing layer 204, a barrier layer 206, and a second light absorbing layer 208 to form separate mesas 207 and 209 including layers 204, 206, and 208. First light absorbing layer 204 and second light absorbing layer 208 include InAsSb.

In the exemplary embodiment, material from photodetector array 100, including, but not limited to, layers 204, 206, and 208, is etched away to form trench 200 defined at least partially by a first side wall 210, a second sidewall 212, and a base 214 extending between first side wall 210 and second sidewall 212. In one embodiment, trench 200 has a height of 6 um and a width of 6.5 um. Sidewalls 210 and 212 are substantially smooth and substantially vertical, such that trench 200 is formed with a "U" shape. Alternatively, trench 200 can have any size or shape that facilitates imaging as described herein. In the exemplary embodiment, trench 200 is sized and shape such that adjacent photodetectors or sensors are electrically insulated from one another.

Trench 200 is formed such that sidewalls 210 and 212 do not undercut a dielectric mask 202. That is, trench 200 is formed such that a distance 214 extending between mask 202 and trench centerline 216 is at least equal to or larger than any distance between sidewall 210 and centerline 214, such as distance 218. Similarly, a distance 220 extending between mask 202 and trench centerline 216 is at least equal to or larger than any distance between sidewall 212 and centerline 214, such as distance 222.

Figure 4:
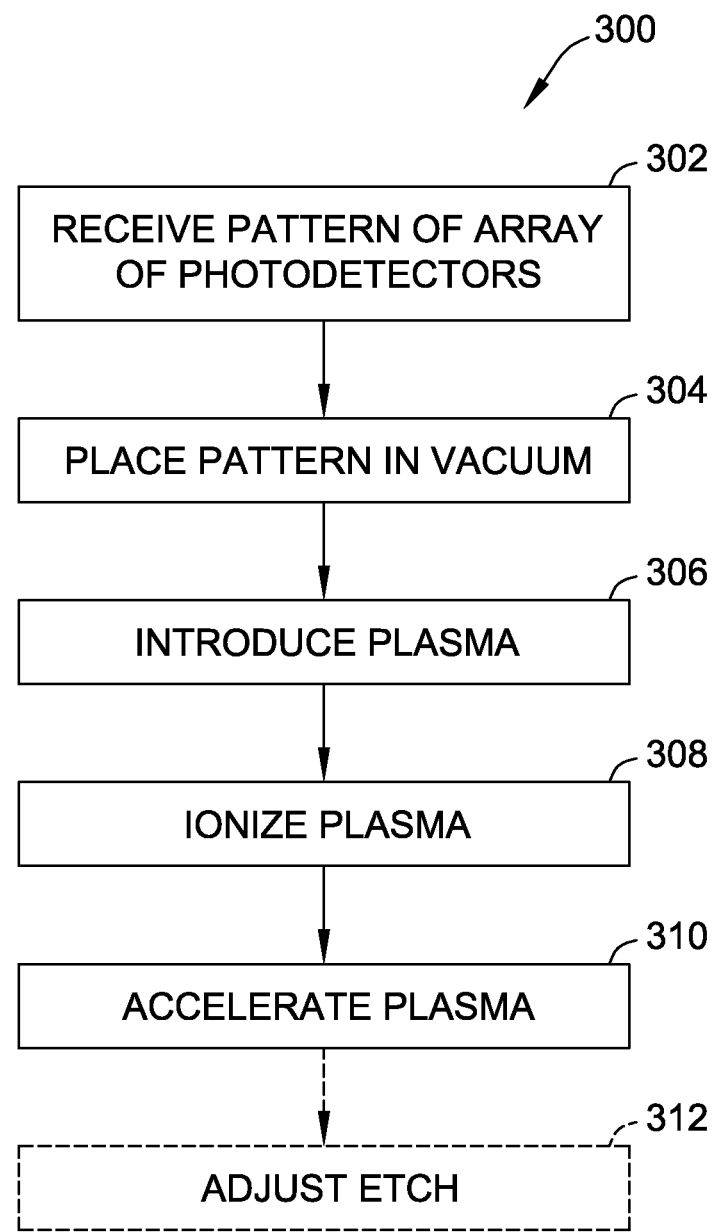
FIG. 4 is a flowchart for an exemplary method of dry etching the trench shown in FIGS. 2 and 3.

FIG. 4 is a flowchart 300 for an exemplary method for dry etching trench 200 shown in FIGS. 2 and 3. In the exemplary embodiment, a pattern of an array of photodetectors formed from InAsSb is received 302. The received pattern 302 includes a plurality of trenches, such as trench 200, shown in FIG. 2, separating adjacent photodetectors. In one embodiment, the trenches are 1-5 um wide. Alternatively, the trenches can be in any amount and have size that facilitates imaging as described herein.

In one embodiment, the received pattern 302 includes depositing a dielectric hard mask on the InAsSb using Plasma Enhanced Chemical Vapor Deposition (PECVD). In one embodiment, the hard mask includes $SiO_2$ and is deposited at 175° C. Alternatively, the hard mask can be deposited with any material at any temperature. A photolithography is performed on the hard mask to define the pattern of the array of photodetectors and the hard mask is etched. In one embodiment, the hard mask is etched using a $CF_4$ plasma. Once the pattern is transferred into the hard mask, the photoresist is removed. In one embodiment, the photoresist is removed using an AZ400T stripper and ultrasounds. Alternatively, the photoresist can be removed in any fashion that facilitates forming trenches as described herein. The InAsSb including the pattern in the hard mask is grease mounted to a carrier for dry etching. In one embodiment, the carrier is a 4 inch Silicone (Si) carrier.

In the exemplary embodiment, after the pattern of an array of photodetectors formed from InAsSb is received 302, the photodetectors are placed in a vacuum chamber 304 in order to perform a dry etching of trenches within the pattern received 302. A plasma of gases is introduced 306 into the vacuum to etch the trenches. In one embodiment, the plasma includes $BCl_3$ and Ar. In some embodiments, $BCl_3$ in the range of 0.1-100 sscm is used and Ar in the range of 1-100 sccm is used. Alternatively, any amount of $BCl_3$ and Ar can be used that facilitates etching as described herein. Before etching of the trenches occurs, the plasma is ionized 306 such that the ions become reactive. In some embodiment, the plasma is ionized 306 using an RF signal. Alternatively, the plasma can be ionized in any manner that facilitates etching as described herein.

After the plasma is ionized 306, the plasma is accelerated 310 such that material is etched away. In the exemplary embodiment, the $BCl_3$ reacts with the In, Ga, Al, As and Sb atoms to form Cl compounds. The Ar ions are configured to mechanically sputter the chemical etch products (e.g., Cl compounds) to cause desorption of the chemical etch products. In one embodiment, the Ar ions also chemically etch a portion of the trenches in addition to the $BCl_3$. The use of $BCl_3$ and Ar enables an etch to occur that results in photodetectors having substantially smooth sidewalls and preventing undercutting of the photodetectors.

In some embodiments, etching of the trenches is adjusted 312. In one embodiment, a rate of the etch is adjusted by adjusting a bias power and/or a pressure. Bias power controls the momentum of the ions and pressure affects the speed of the ions by changing their mean free path. As such, bias power and/or pressure affects the rate of etching. In the exemplary embodiment, a bias voltage is in the range of 10-300V and a pressure is in the range of 1-20 mT. Alternatively, the bias power can be any voltage and the pressure can be any pressure that facilitates etching as described herein. In one embodiment, a pressure is increased to improve the morphology at the bottom of the mesas of the photodetectors and a pressure is decreased to improve the morphology at the top of the mesas of the photodetectors. As used herein "morphology" refers to at least one of a verticality and roughness of a surface of a mesa. As used herein "roughness" refers to a deviation of a surface from a flat plane. In some implementations, "roughness" or "a rough surface" includes a surface having one or more cracks, high mounts, or holes. Similarly, "smooth" or "smoothness" refers to a surface that is substantially devoid of imperfections (e.g., cracks, high mounts, and holes) and is substantially free of roughness. Accordingly, in some implementations, improving a morphology can include altering at least one of a verticality and a roughness of a surface of a mesa.

In some embodiments, etching is adjusted 312 by changing an ICP power. Increasing an ICP power improves the morphology at the bottom of the sidewalls of the photodetectors. Similarly, a gas ratio of the plasma used for etching may also be adjusted to improve the morphology of the sidewalls. In one embodiment, a proportion of Ar to $BCl_3$ is increased to achieve a smooth etching on sidewalls of the photodetectors. In the exemplary embodiment, the ICP power used for etching is in the range of 100-1200 W. Alternatively, any ICP power and gas ratio can be used that facilitates etching as described herein. In one embodiment, a temperature is adjusted to change or determine a slope of sidewalls of the photodetectors. As the temperature within the vacuum is increased, sidewalls of the photodetectors become more vertical. It should be noted that trenches are created between photodetectors such that no undercutting of the photodetectors occurs.

In the exemplary embodiment, etching of trenches is achieved such that substantially no damage to the lateral surface of the mesas of the sidewalls is incurred because barrier layer 206 is exposed in this area. If the material around barrier layer 206 is damaged an increase in a dark current of a device may occur, generating surface leakage in photodetectors. Such current leakage in photodetectors can increase the noise of images taken with the device using the damaged photodetectors.

Figure 5A:
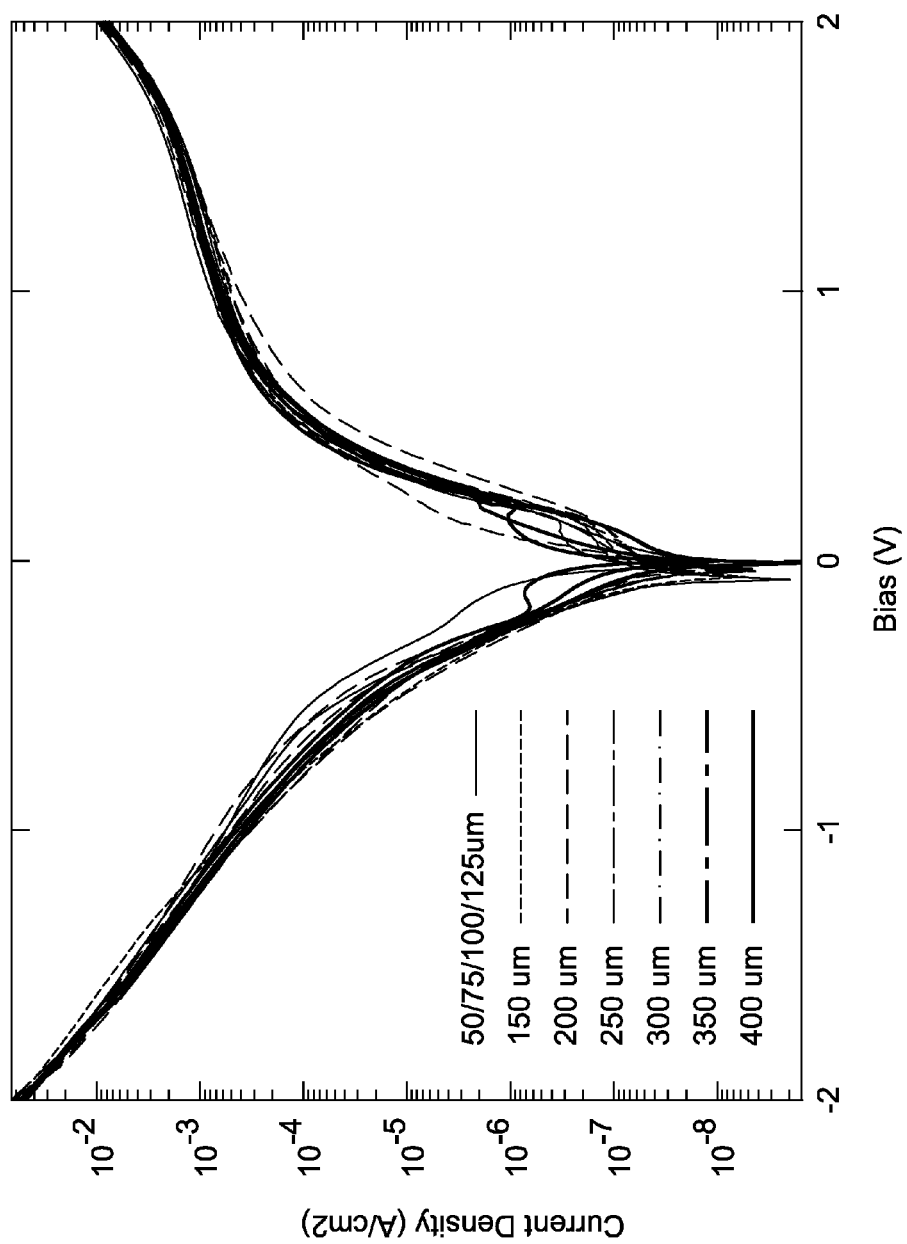
FIG. 5A is a diagram measuring an I-V characteristics of an array of photodetectors etched by a wet etch process.
Figure 5B:
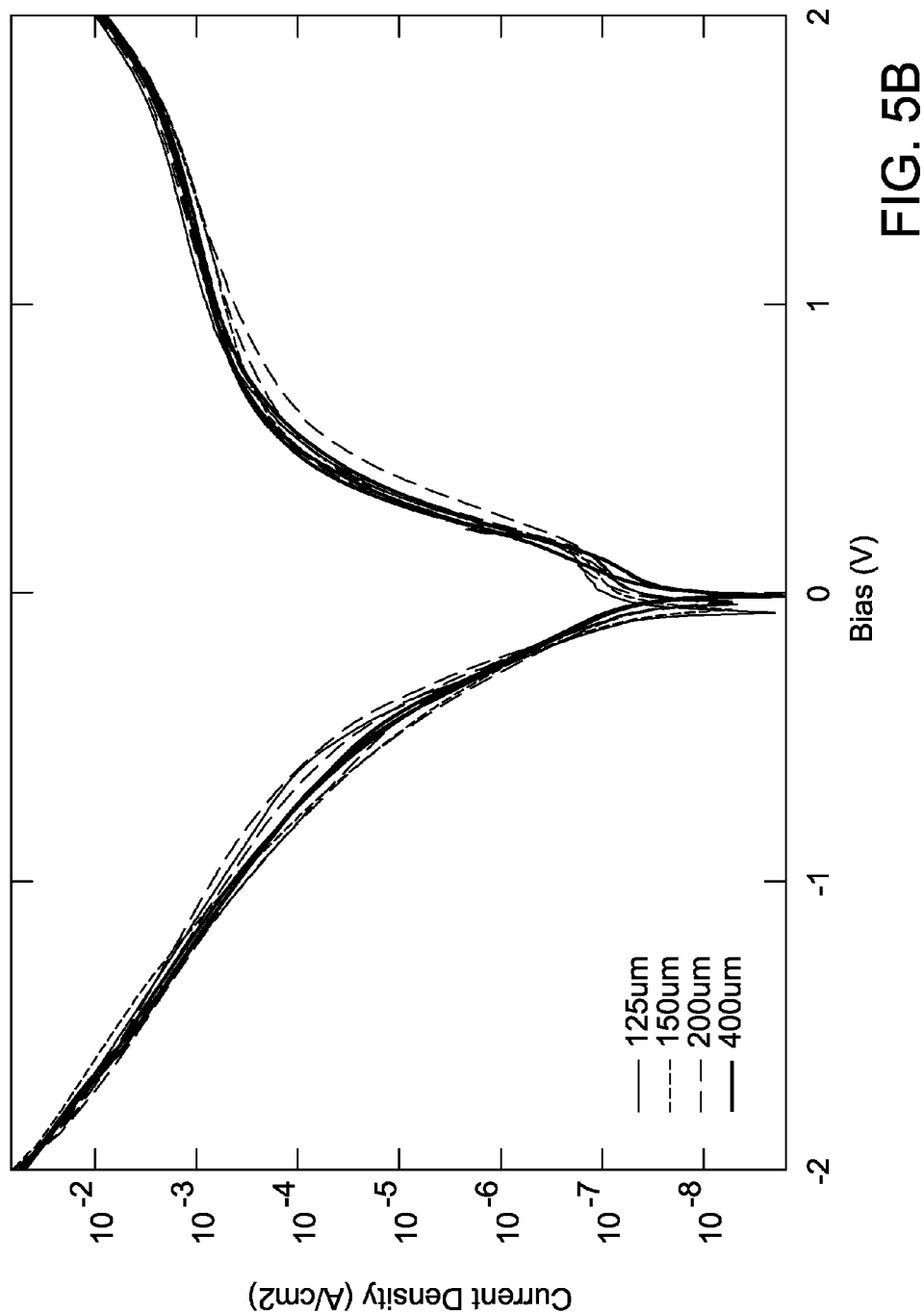
FIG. 5B is a diagram measuring I-V characteristics of an array of photodetectors etched by dry etch process, such as the method shown in FIG. 4.

FIG. 5A is a diagram measuring an I-V characteristics of an array of photodetectors etched by a wet etch process at 120K and FIG. 5B is a diagram measuring I-V characteristics of an array of photodetectors etched by dry etch process 300, shown in FIG. 4, at 120K. FIGS. 5A and 5B each illustrate a current density ($A/cm^2$) in proportion to a bias voltage (V). Such a diagram may reveal damage caused during an etching of a trench. For comparison, the following equation is used to illustrate material damage of photodetectors leading to dark current of devices: $J_T = J_{Bulk} + P/A \, J_{Surface}$. In the equation, $J_T$ is the total dark current density, $J_{Bulk}$ is the dark current density of the bulk, P is the perimeter of the device, A is the area of the device, and $J_{Surface}$ is the surface leakage density along the sidewall.

As compared to at least some known etching systems, the systems and methods described herein enable dry etching of trenches within a photodetector array that substantially prevents and/or eliminates undercutting of photodetectors. Forming trenches that do not undercut photodetectors prevents a deformation of optical responses per pixel which provides higher sensitive images. The systems and methods described herein also enable creating trenches that electrically insulate adjacent photodetectors leaving the photodetectors with substantially smooth, vertical sidewalls while preserving the electrical performance. A low bias operation of large area devices is also achieved using the methods and systems described herein.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose various embodiments, which include the best mode, to enable any person skilled in the art to practice those embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method for fabricating an array of photodetectors, said method comprising:
   receiving a pattern of an array of photodetectors formed from InAsSb, the pattern including at least one trench defined between adjacent photodetectors; and
   dry etching the at least one trench with a plasma including BrCl3 and Ar.

2. The method according to claim 1, further comprising mechanically sputtering Ar ions to at least one of chemical etch the at least one trench and to cause desorption of Cl compounds formed by the dry etching.

3. The method according to claim 1, wherein the pattern of the array of photodetectors is formed by:
   depositing a dielectric hard mask;
   defining the pattern of the array of photodetectors in the hard mask using photolithography;
   etching the pattern on the dielectric hard mask; and
   removing the dielectric hard mask using at least one of a stripper and ultrasound.

4. The method according to claim 1, wherein dry etching the at least one trench further comprises dry etching the at least one trench to form substantially smooth sidewalls of the array of photodetectors.

5. The method according to claim 1, wherein dry etching the at least one trench further comprises adjusting a bias power to control a dry etching rate.

6. The method according to claim 1, wherein dry etching the at least one trench further comprises increasing ICP power to improve morphology at a bottom of sidewalls of the photodetectors.

7. The method according to claim 1, wherein dry etching the at least one trench further comprises increasing a proportion of Ar to improve smoothness of the sidewalls the array of photodetectors.

8. The method according to claim 1, wherein dry etching the at least one trench further comprises at least one of increasing a pressure to improve morphology at a bottom of one or more mesas of the photodetectors or decreasing the pressure to improve morphology on a top of the one or more mesas of the photodetectors.

9. The method according to claim 3, wherein depositing a dielectric hard mask further comprises depositing a dielectric hard mask including SiO2 using plasma enhanced vapor deposition.

10. The method according to claim 3, wherein etching the pattern on the dielectric further comprises etching the pattern on the dielectric hard mask using a CF4 plasma.

11. A method of imaging using a photodetector array, said method comprising:
   providing a photodetector array; and
   receiving wavelengths by a first photodetector of the photodetector array and a second photodetector of the photodetector array, wherein a trench is formed between the first photodetector and the second photodetector, the trench formed by dry etching using BrCl3 and Ar.

12. The method according to claim 11, wherein receiving wavelengths by a first photodetector of the photodetector array and a second photodetector of the photodetector array further comprises receiving wavelengths by a first photodetector of the photodetector array and a second photodetector of the photodetector array on a first band and a second band.

13. The method according to claim 11, wherein receiving wavelengths by a first photodetector of the photodetector array and a second photodetector of the photodetector array further comprises receiving wavelengths by a first photodetector of the photodetector array having substantially smooth sidewalls and a second photodetector of the photodetector array having substantially smooth sidewalls.

14. The method according to claim 11, wherein receiving wavelengths by a first photodetector of the photodetector array and a second photodetector of the photodetector array further comprises receiving wavelengths by a first photodetector of the photodetector array having substantially vertical sidewalls and a second photodetector of the photodetector array having substantially vertical sidewalls.

15. A photodetector array for use in imaging, said photodetector array comprising:
   a first photodetector formed from InAsSb;
   a second photodetector formed from InAsSb; and
   a trench formed between the first photodetector and the second photodetector such that the first photodetector is electrically insulated from the second photodetector, wherein the trench is formed using BrCl3 and Ar.

16. The photodetector array according to claim 15, wherein the trench is formed such that sidewalls of the first photodetector and the second photodetector are substantially smooth.

17. The photodetector array according to claim 15, wherein the trench is formed such that sidewalls of the first photodetector and the second photodetector are substantially vertical.

18. The photodetector array according to claim 15, wherein the first photodetector and the second photodetector are configured to operate in a dual band capacity.

19. The photodetector array according to claim 15, wherein the first photodetector and the second photodetector are configured to process infrared signals.

20. A photodetector array for use in imaging, said photodetector array comprising:
   a first photodetector formed from InAsSb;
   a second photodetector formed from InAsSb; and
   a trench formed between the first photodetector and the second photodetector such that the first photodetector is electrically insulated from the second photodetector.

* * * * *